United States Patent
Higashi et al.

(10) Patent No.: US 7,893,478 B2
(45) Date of Patent: Feb. 22, 2011

(54) SEMICONDUCTOR STORAGE DEVICE AND DRIVING METHOD THEREOF

(75) Inventors: Tomoki Higashi, Yokohama (JP); Takashi Ohsawa, Yokohama (JP); Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 430 days.

(21) Appl. No.: 12/060,522

(22) Filed: Apr. 1, 2008

(65) Prior Publication Data

US 2008/0251830 A1    Oct. 16, 2008

(30) Foreign Application Priority Data

Apr. 13, 2007  (JP) .................... 2007-106069

(51) Int. Cl.
*H01L 27/108* (2006.01)
*H01L 29/94* (2006.01)
*H01L 23/52* (2006.01)
*H01L 21/70* (2006.01)
*H01L 29/66* (2006.01)

(52) U.S. Cl. .................. 257/296; 257/208; 257/273; 257/560

(58) Field of Classification Search ......... 257/208–211, 257/235–237, 273, 288, 296, 314–326, 347–350, 257/567–570; 365/174–190, 220–222; 438/151, 438/238, 241–244
See application file for complete search history.

(56) References Cited

U.S. PATENT DOCUMENTS

| | | | |
|---|---|---|---|
| 6,104,045 A * | 8/2000 | Forbes et al. ................. | 257/141 |
| 6,825,524 B1 * | 11/2004 | Ikehashi et al. ............. | 257/314 |
| 7,301,195 B2 * | 11/2007 | Nakajima et al. ........... | 257/315 |
| 2004/0159853 A1 * | 8/2004 | Nemati et al. ................ | 257/133 |
| 2005/0001232 A1 * | 1/2005 | Bhattacharyya ............. | 257/133 |
| 2006/0181919 A1 | 8/2006 | Forbes | |

* cited by examiner

*Primary Examiner*—Ha Tran T Nguyen
*Assistant Examiner*—Karen M Kusumakar
(74) *Attorney, Agent, or Firm*—Oblon, Spivak, McClelland, Maier & Neustadt, L.L.P.

(57) ABSTRACT

This disclosure concerns a semiconductor storage device comprising a semiconductor layer provided on the insulation layer provided on the semiconductor substrate; a source layer and a drain layer provided in the semiconductor layer; a body provided between the source layer and the drain layer, the body being in an electrically floating state; an emitter layer contacting with the source layer, the emitter layer having an opposite conductive type to the source layer; a word line including the source layer, the drain layer, and the body, the word line being provided to memory cells arrayed in a first direction in a plurality of tow-dimensionally arranged memory cells; a source line connected to the source layers of the memory cells arrayed in the first direction; and a bit line connected to the drain layers of the memory cells arrayed in a second direction intersecting the first direction.

12 Claims, 10 Drawing Sheets

WRITE OF DATA "1"

WRITE OF DATA "0"

WRITE OF DATA "0"

FIRST MODIFICATION

WRITE OF DATA "0"

SECOND MODIFICATION

WRITE OF DATA "0"

THIRD MODIFICATION

DATA READ OPERATION

DATA RETENTION OPERATION

SECOND EMBODIMENT

THIRD EMBODIMENT

SEMICONDUCTOR STORAGE DEVICE AND DRIVING METHOD THEREOF

CROSS-REFERENCE TO RELATED APPLICATION

This application is based upon and claims the benefit of priority from the prior Japanese Patent Applications No. 2007-106069, filed on Apr. 13, 2007, the entire contents of which are incorporated herein by reference.

BACKGROUND OF THE INVENTION

1. Field of the Invention

The present invention relates to a semiconductor storage device and a driving method thereof.

2. Related Art

Recently, there is an FBC (Floating Body Cell) memory device as a semiconductor storage device expected to be an alternative to a 1T (Transistor)-1C (Capacitor) type DRAM. The FBC memory device is formed by FET (Field Effect Transistor) including a floating body (hereinafter referred to as body) on an SOI (Silicon On Insulator) substrate. In the FBC memory device, data "1" or data "0" is stored according to the number of majority carriers accumulated in the body.

A bipolar write type FBC memory (hereinafter sometimes referred to as bipolar FBC) has been developed to enables efficient data write (see JP-A 2005-79314 (KOKAI)). The bipolar FBC includes a drain layer and an emitter layer constituting a pn-junction. Therefore, the bipolar transistor includes the emitter layer, the drain layer, and the body. In writing data, the bipolar transistor is driven to accumulate a charge in the body.

However, in the memory disclosed in JP-A 2005-79314 (KOKAI), because the data is selectively written, it is necessary to provide the emitter layer in each bit line (in each column). That is, in memory cells adjacent in a bit line direction (in a column direction), the emitter layer cannot be shared, but the emitter layer is provided in each column. Therefore, unfortunately a large occupation area of each memory cell increases dimensions of the whole of the memory device.

In a memory disclosed in U.S. patent application Laid-open No. 2006-181919, a memory bipolar transistor includes an emitter layer, a bulk substrate, and a body. In order to prevent short-circuit between a drain layer and the bulk substrate, the body (n-type well) is largely diffused, whereby the drain layer is covered with the body. Accordingly, in U.S. patent application Laid-open No. 2006-181919, use of the bulk substrate is required, and the emitter layer is not adjacent to the drain layer and a source layer. When the emitter layer is separated from the drain layer and source layer, the dimensions of the memory cell are increased.

SUMMARY OF THE INVENTION

A semiconductor storage device according to an embodiment of the present invention comprises a semiconductor substrate; an insulation layer provided on the semiconductor substrate; a semiconductor layer provided on the insulation layer; a source layer provided in the semiconductor layer; a drain layer provided in the semiconductor layer; a body provided in the semiconductor layer between the source layer and the drain layer, the body being in an electrically floating state, and accumulating or emitting a charge to store data; an emitter layer contacting with the source layer, the emitter layer having an opposite conductive type to the source layer; a word line including the source layer, the drain layer, and the body, the word line being provided to memory cells arrayed in a first direction in a plurality of two-dimensionally arranged memory cells; a source line connected to the source layers of the memory cells arrayed in the first direction; and a bit line connected to the drain layers of the memory cells arrayed in a second direction intersecting the first direction.

A method for driving a semiconductor storage device according to an embodiment of the present invention including two-dimensionally arranged memory cells and an emitter layer, the memory cell including an electrically-floating body provided between a source layer and a drain layer, the memory cell storing data by accumulating or emitting a charge in the body, the emitter layer contacting with the source layer, the emitter layer having an opposite conductive type to the source layer, the semiconductor storage device driving method comprising applying a forward bias to a junction between the emitter layer and the source layer to accumulate the charges in the body.

DETAILED DESCRIPTION OF THE INVENTION

Exemplary embodiments of the invention will be described below with reference to the drawings. However, the invention is not limited to the following embodiments.

First Embodiment

Figure 1:
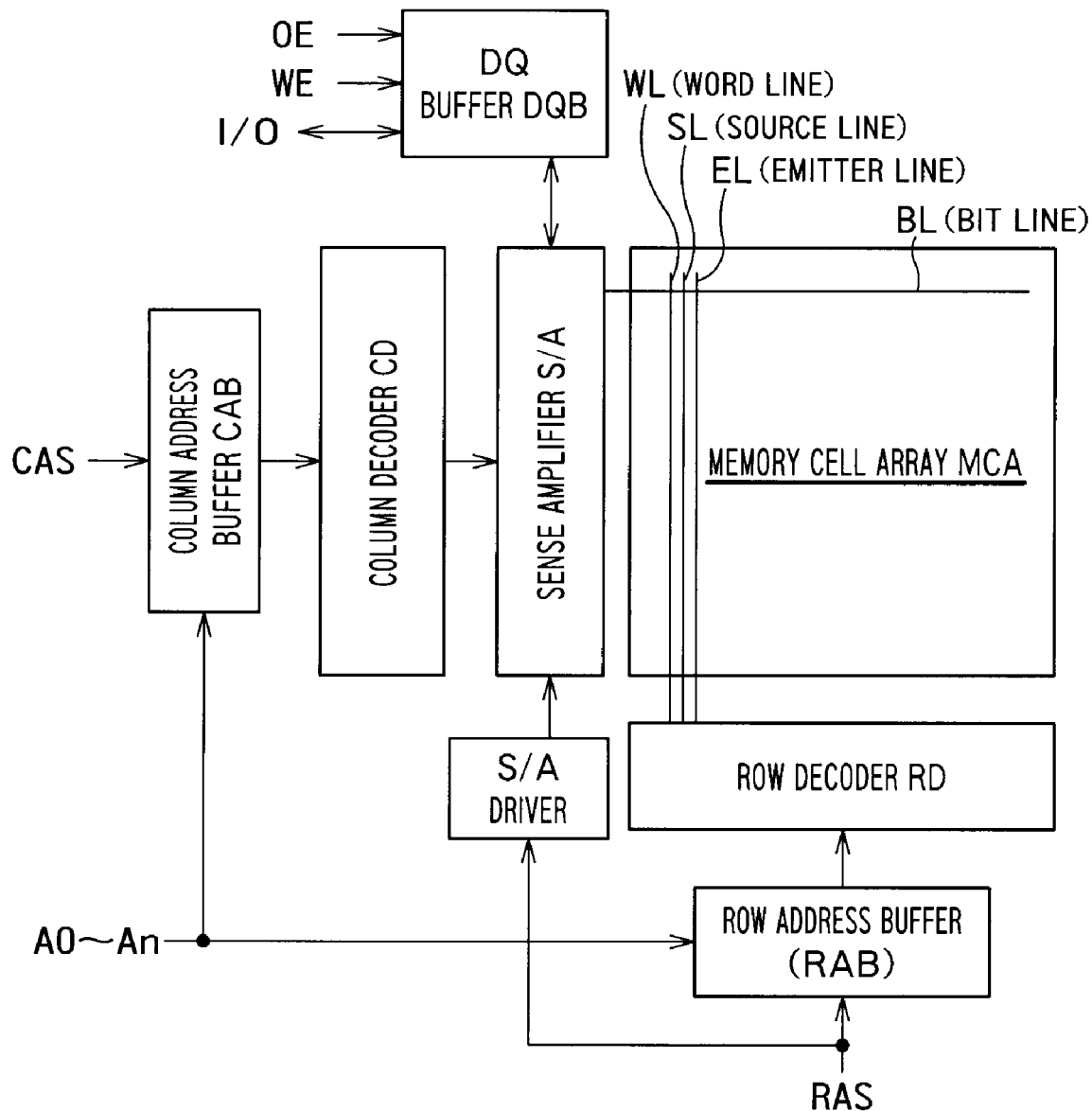
FIG. 1 is a block diagram showing a configuration of an FBC memory according to a first embodiment of the invention.

FIG. 1 is a block diagram showing a configuration of an FBC memory according to a first embodiment of the invention. The FBC memory includes a memory cell array MCA and a sense amplifier S/A. The memory cell array MCA includes many memory cells which are two-dimensionally arranged in a matrix. A word line WL, a source line SL, and an emitter line EL are connected to the memory cells arrayed in a row direction which is of a first direction. A bit line BL is connected to memory cells arrayed in a column direction (second direction) orthogonal to the row direction.

The sense amplifier S/A is connected to the bit line BL. The sense amplifier S/A is configured such that data is read from the memory cell through the bit line BL or such that data is written in the memory cell through the bit line BL. The sense amplifier S/A is provided corresponding to the bit line BL or a pair of bit lines.

A row address buffer RAB receives a row address signal RAS from the outside, tentatively stores the row address signal RAS, and outputs the row address signal RAS to a row decoder RD. The row decoder RD selects the word line WL, the source line SL, and the emitter line EL according to the row address signal RAS. A column address buffer CAB receives a column address signal CAS from the outside, tentatively stores the column address signal CAS, and outputs the column address signal CAS to the column decoder CD. The column decoder CD selects the bit line of the memory cell array MCA according to the column address signal CAS.

A DQ buffer DQB is connected between the sense amplifier S/A and the input and output unit I/O. The DQ buffer DQB tentatively stores the read data from the sense amplifier S/A to output the read data to the outside of the memory, or the DQ buffer DQB tentatively stores the write data from the outside of the memory to transmit the write data to the sense amplifier S/A. The data output from the DQ buffer DQB to the outside is controlled by an output enable signal OE. The data write in the DQ buffer DQB from the outside is controlled by a write enable signal WE.

Figure 2:
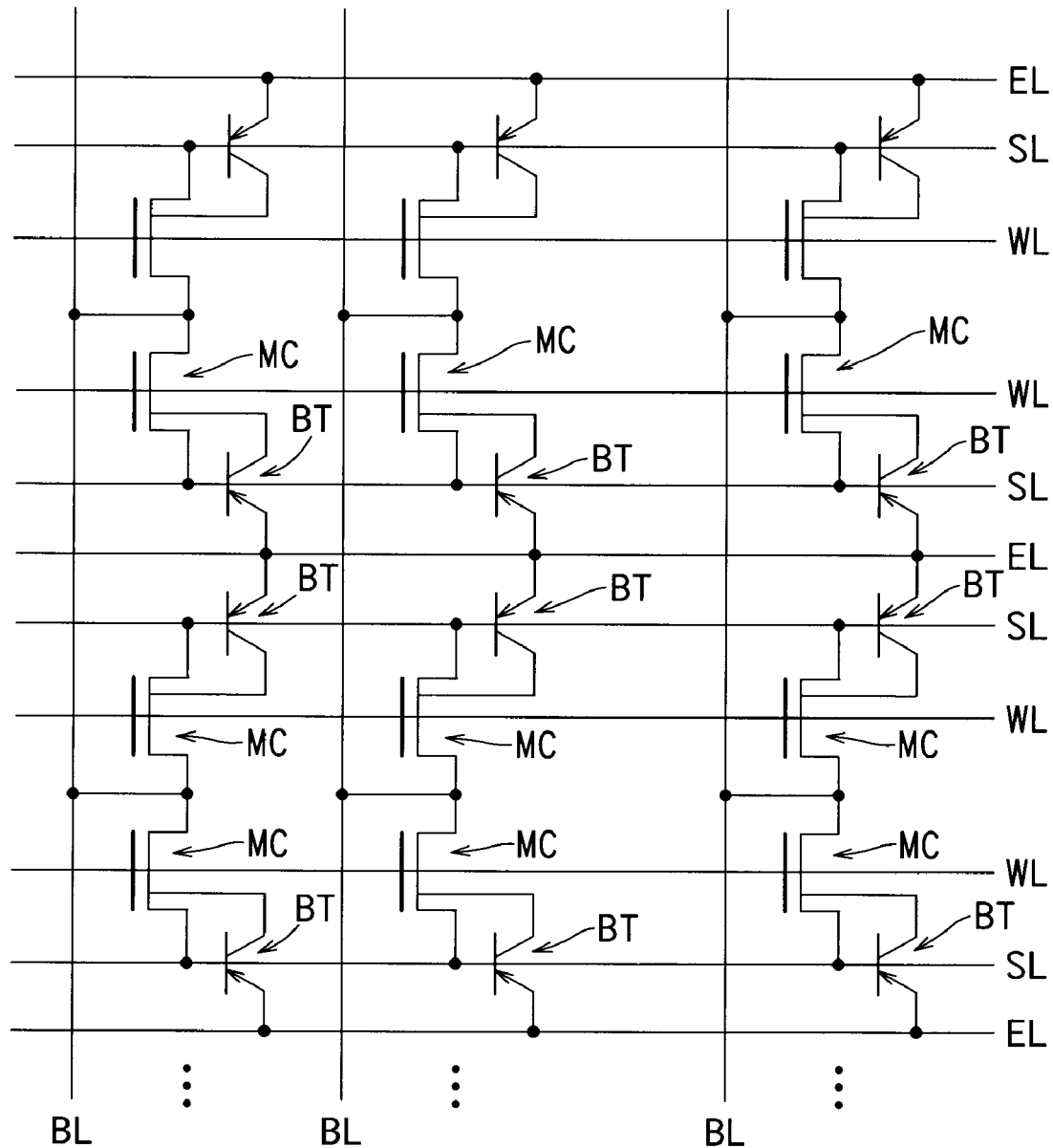
FIG. 2 is a circuit diagram showing a part of the memory cell array MCA of the first embodiment.

FIG. 2 is a circuit diagram showing a part of the memory cell array MCA of the first embodiment. The memory cell array MCA of the first embodiment includes a plurality of memory cells MC which are two-dimensionally arranged in the matrix. The bit line BL is extended in the column direction which is of the second direction, and the bit line BL is connected to the memory cells MC arrayed in the column direction. The word line WL, source line SL, and emitter line EL are extended in the row direction which is of the first direction, and the word line WL, source line SL, and emitter line EL are connected to the memory cells MC arrayed in the row direction.

A bipolar transistor BT is provided while corresponding to each memory cell MC. In the bipolar transistor BT, the body of the memory cell MC is used as a collector and the source of the memory cell MC is used as a base. The bipolar transistor BT includes the emitter provided adjacent. The emitter line EL is shared by the two memory cells MC which are adjacent on the source side in the column direction. The bit line BL is shared by the two memory cells MC which are adjacent on the drain side in the column direction. The bipolar transistor BT is used to write the data.

Figure 3:
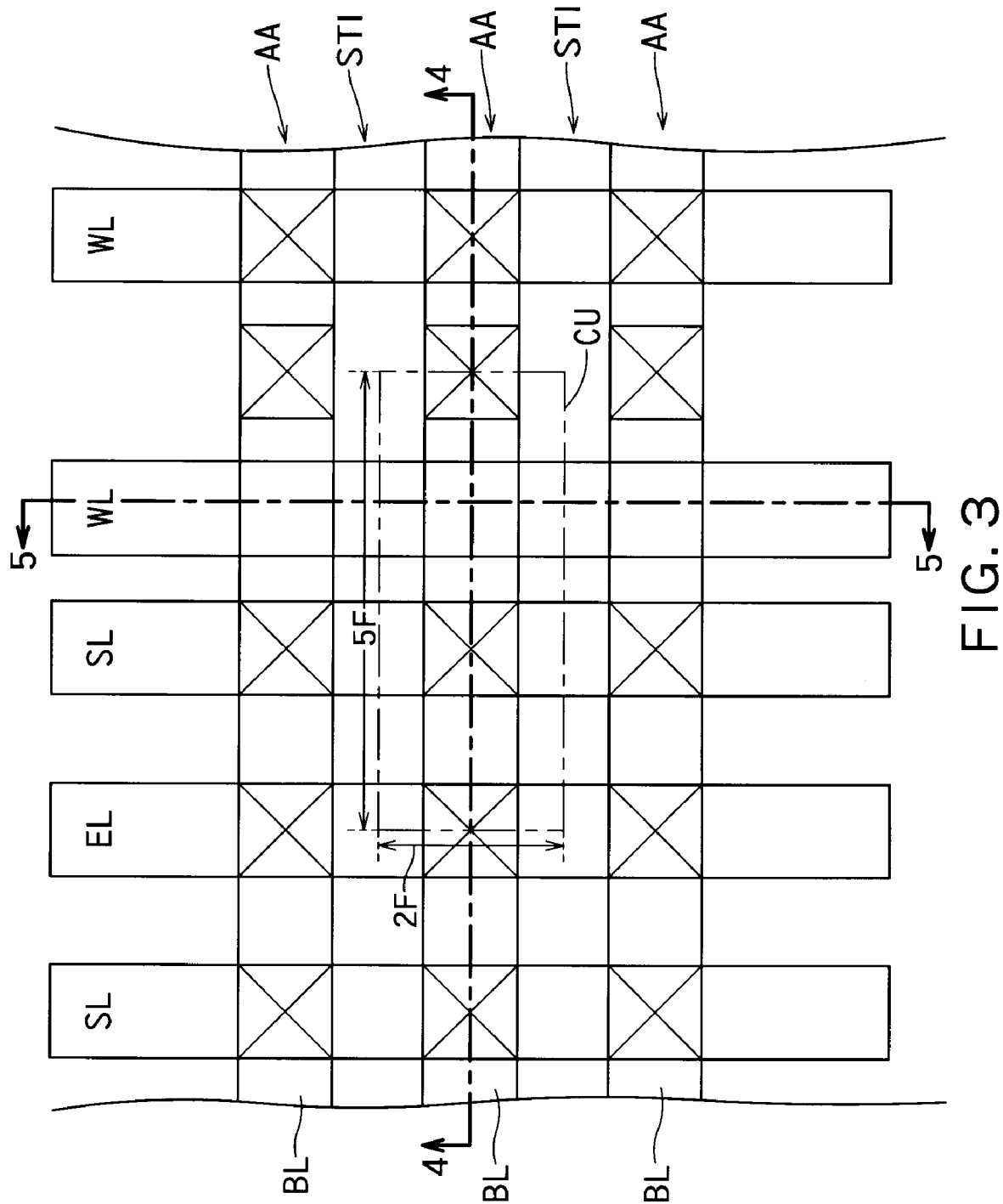
FIG. 3 is a plan view showing a layout of the bit line BL, word line WL, source line SL, and emitter line EL.

FIG. 3 is a plan view showing a layout of the bit line BL, word line WL, source line SL, and emitter line EL. An SOI layer 30 is separated by an isolation area STI (Shallow Trench Isolation) extended in the column direction to form a stripe active area AA. The active area AA is separated by the isolation area STI extended in the column direction. Therefore, the active area AA is also extended in the column direction. The memory cell MC of one unit is expressed by a cell unit CU shown in FIG. 3. The memory cell array MCA is configured by repeatedly forming the cell unit CU in the column direction and in the row direction.

Figure 4:
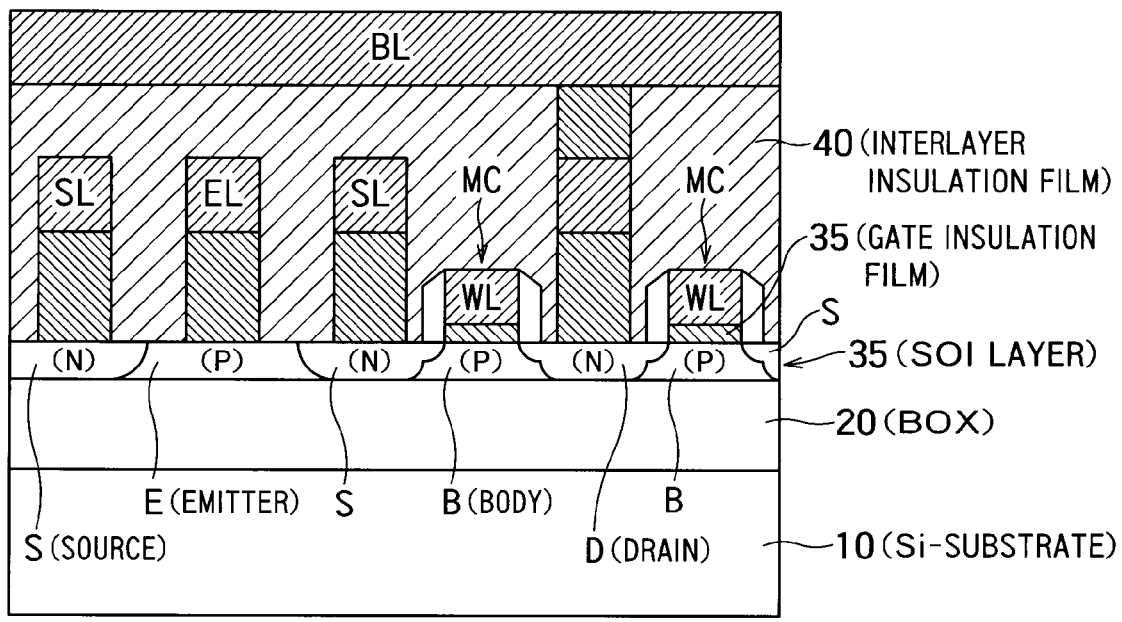
FIG. 4 is a sectional view taken along a line 4-4 of FIG. 3.
Figure 5:
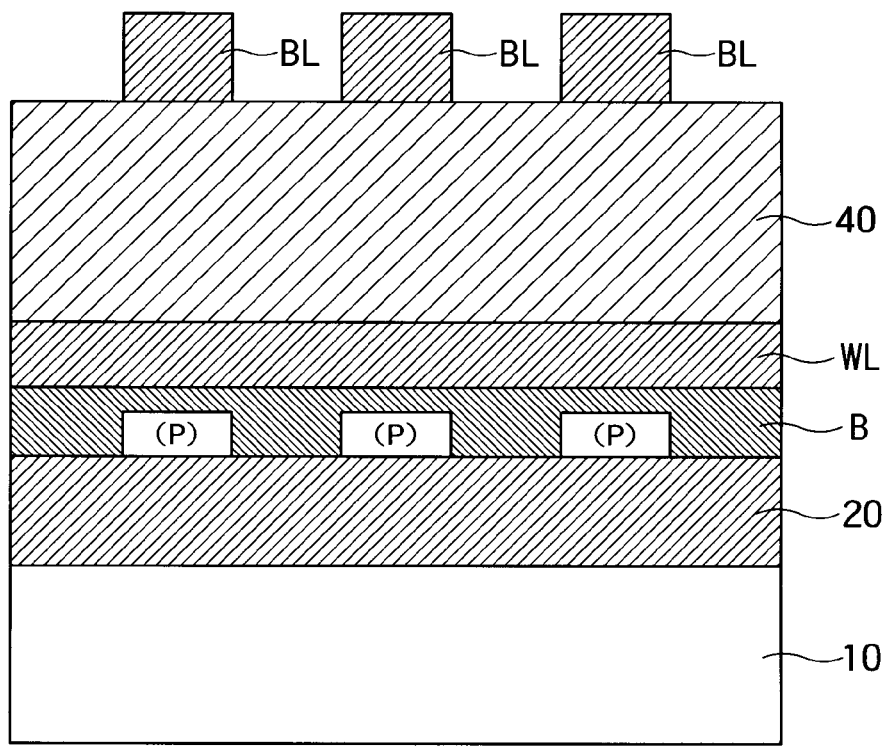
FIG. 5 is a sectional view taken along a line 5-5 of FIG. 3.

FIG. 4 is a sectional view taken along a line 4-4 of FIG. 3. FIG. 5 is a sectional view taken along a line 5-5 of FIG. 3. The FBC memory of the first embodiment includes a silicon substrate 10, a buried insulation film (hereinafter referred to as BOX (Buried Oxide) layer) 20 provided on the silicon substrate 10, the SOI layer 30 which is of a semiconductor layer provided on the BOX layer 20, a source layer S provided in the SOI layer 30, a drain layer D provided in the SOI layer 30, a body B provided in the SOI layer 30 between the source layer S and the drain layer D, an emitter layer E adjacent to the source layer S, a gate insulation film 35 provided on the body B, the word line WL provided on the gate insulation film 35, the source line SL connected to the source layer S, the bit line BL connected to the drain layer D, the emitter line EL connected to the emitter layer E, and an interlayer insulation film 40 with which the gap between the interconnections is filled.

The body B is surrounded by the gate insulation film 35, the BOX layer 20, the source layer S, the drain layer D, and the isolation area STI, and the body B is in an electrically floating state. The memory cell MC includes the body B, the source layer S, the drain layer D, the gate insulation film 35, and the word line WL (gate electrode). The memory cell MC stores the data "1" or "0" by accumulating the charge (for example, hole) in the body B which is in the floating state or by emitting the charge from the body B. Hereinafter, a memory cell storing data "1" is called "1" cell, A memory cell storing data "0" is called "0" cell.

The word line WL has a function as a gate electrode of the memory cell MC in addition to the function as the word line. In other words, the gate electrode of the memory cell MC is formed so as to be extended in the row direction, and the gate electrode of the memory cell MC functions as the word line WL. The word line WL is shared by the memory cells MC arrayed in a certain row. The source line SL is extended in the row direction, and the source line SL is commonly connected to the source layers S of the memory cells MC arrayed in a certain row. The bit line BL is extended in the column direction, and the bit line BL is commonly connected to the drain layers D of the memory cells MC arrayed in a certain column.

The emitter layer E is made of a reversely conductive type semiconductor with respect to the source layer S and drain layer D. The emitter layer E is adjacent to the source layer S. Therefore, a pn-junction is formed between the emitter layer E and the source layer S. The emitter layer E is adjacent to the source layer S on the opposite side to the body B. The emitter line EL is extended in the row direction in parallel with the word line WL and source line SL. The emitter line EL is commonly connected to the emitter layers E of the memory cells MC arrayed in the row direction.

For example, in the case where the memory cell MC is formed by the n-type MISFET, the source layer S and the drain layer D are formed by the n-type semiconductor, and the body B and the emitter layer E are formed by the p-type semiconductor. Therefore, a PNP bipolar transistor BT includes the body B, the source layer S, and the emitter layer E. The hole can be accumulated in the body B from the emitter layer E by driving the bipolar transistor BT. For example, the state in which relatively many holes are accumulated in the p-type body B is set to data "1", and the state in which relatively few holes are accumulated in the p-type body B is set to data "0". In this case, the hole is accumulated in the body B by driving the bipolar transistor BT. Therefore, the data "1" can be written in the memory cell MC.

In the first embodiment, the emitter layer E is provided adjacent to the source layer S. The emitter line EL is shared by the two memory cells MC which are adjacent on the source side in the column direction. The bit line BL is shared by the two memory cells MC which are adjacent on the drain side in the column direction. Therefore, the occupation area of the memory cell (area of cell unit CU) becomes smaller than that of the conventional technique. Because the many memory cells MC are provided in the memory cell array MCA, the reduced area of the cell unit CU contributes largely to the miniaturization of the whole of the FBC memory device.

Figure 6:
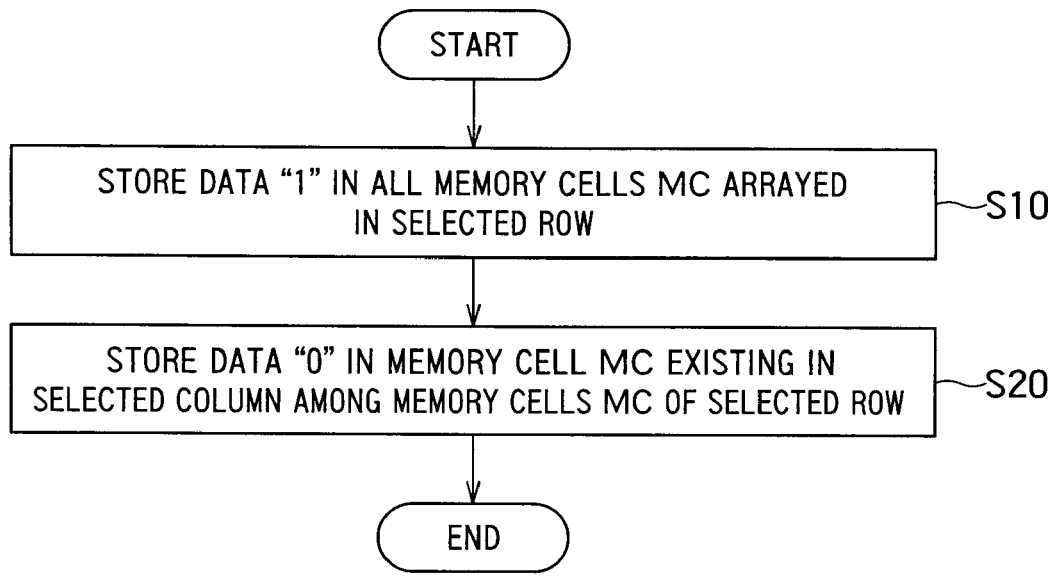
FIG. 6 is a flowchart showing the operation performed by the FBC memory of the first embodiment.

An operation of data write in the FBC memory of the embodiment will be described below. FIG. 6 is a flowchart showing the operation performed by the FBC memory of the first embodiment. In the first embodiment, as shown in FIG. 6, the data is written in two steps in the memory cells MC arrayed in the selected row.

More particularly, in first step S10, the row decoder RD selectively drives the source line SL in a certain row. This enables the holes to be accumulated in the bodies B of all the memory cells MC connected to the selected source line SL. That is, the data "1" is stored in all the memory cells MC arrayed in the selected row.

Then, in second step S20, the sense amplifier S/A selectively drives only the bit line BL connected to the memory cell MC, in which the write of data "0" is required, of the "1" cells in the selected row. Therefore, the holes are emitted from body B of the memory cell MC existing in the selected column. That is, the data "0" is stored in the memory cell MC existing in the selected column in the memory cells MC of the selected row.

Thus, in the first embodiment, the data "1" is tentatively written in all the memory cells of the selected row, and the data "0" is written only in the memory cell MC existing in the column in which the write of the data "0" is required. Therefore, one of the data "1" and data "0" can arbitrarily written in the memory cell MC of the selected row.

The first step S10 and the second step S20 will be described in detail.

[First Step S10: Write Operation of Data "1" (Bipolar Write)]

Figure 7:
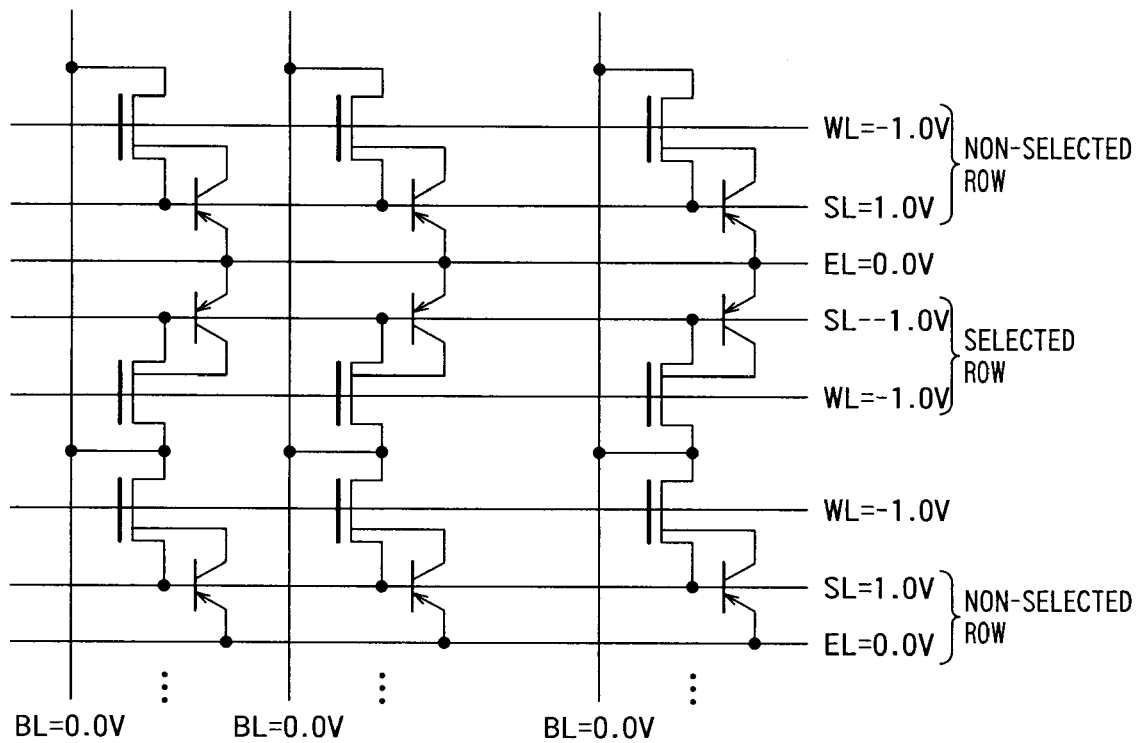
FIG. 7 shows a voltage relationship among the interconnections during the write operation of data "1"

FIG. 7 shows a voltage relationship among the interconnections during the write operation of data "1". All the bit lines BL are set to 0 V and non-selected source line SL is set to 1.0 V. All the word lines WL are set to −1.0 V. All the emitter lines EL are set to 0 V. The non-selected source line SL has a potential higher than that of the emitter line EL. Therefore, a reverse bias is applied to the pn-junction between the source layer S and the emitter layer E. Accordingly, because the bipolar transistor of the non-selected row is kept in the off state (non-conduction state), and the holes are not injected in the bodies B in the memory cells MC arrayed in the non-selected row.

On the other hand, the selected source line SL which is of the first source line is set to −1.0 V. The selected source line SL has a potential lower than that of the emitter line EL. A forward bias is applied to the pn-junction between the source layer S and the emitter layer E, and the bipolar transistor BT of the selected row becomes the on state (conduction state). Accordingly, the holes are injected into the bodies B of the memory cells MC arrayed in the selected row. Because the drain layer D has the potential higher than that of the body B, the holes injected into the body B are accumulated in the body B. Therefore, the data "1" is written in all the memory cells MC arrayed in the selected row.

In the bipolar write, the word lines WL are not activated, but maintained at the same potential (−1.0 V) as that in retaining the data.

[Second Step S20: Write Operation of Data "0"]

Figure 8:
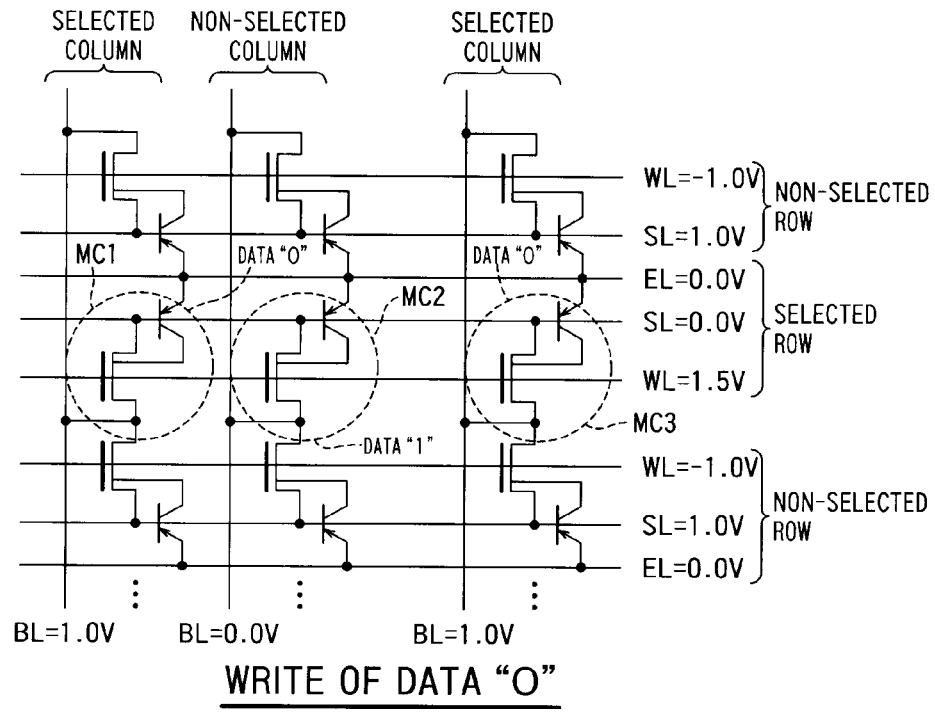
FIG. 8 shows a voltage relationship among the interconnections during the write operation of data "0"

FIG. 8 shows a voltage relationship among the interconnections during the write operation of data "0". In writing the data "0", the voltage of 1.0 V is applied to the bit line BL (first bit line) of the selected column, and the voltage of 0 V is applied to the bit line BL of the non-selected column. The voltage of 0 V is applied to the source line SL of the selected row, and the voltage of 1.0 V is applied to the source line SL of the non-selected row. The voltage of 1.5 V is applied to the word line WL of the selected row, and the voltage of −1.0 V is applied to the word line WL of the non-selected row. The voltage of 0 V is applied to all the emitter lines EL.

Therefore, in the memory cells MC arrayed in the selected row, the potentials at the bodies B of the memory cells MC1 and MC3 existing in the selected column are higher than the potential at the source layer S. Therefore, a forward bias is applied to the pn-junction between the body B and the source layer S, and the holes accumulated in the body B are emitted to the source layer S. Accordingly, the data "0" is written in the memory cells MC1 and MC3.

In the memory cells MC arrayed in the selected row, the potential at the drain layer D of the memory cell MC2 existing in the non-selected column is equal to the potential at the source layer S. The reverse bias can be maintained in the pn-junction between the body B and the source layer S and the pn-junction between the body B and the drain layer D, while the potential at the body B is slightly increased by the coupling with the potential at the word line WL. Accordingly, because the holes accumulated in the body B are not emitted, the data "1" stored in the memory cell MC2 is retained.

The potentials at the word lines WL of the memory cells MC arrayed in the non-selected row are lower than the potentials at the bit line BL and source line SL. In this case, the holes are retained because the potential at the body B becomes sufficiently lower than the potentials at the source layer S and drain layer D.

Thus, in the first embodiment, the binary data "1" or "0" can be written in an arbitrary memory cell in the selected row by performing two steps S10 and S20. That is, the data can be written in all the memory cells arrayed in one row by two steps S10 and S20. In the first embodiment, each of the emitter layer E and the drain layer D is shared by the two memory cells MC adjacent to each other in the column direction. Therefore, the occupation area of the memory cell MC is reduced. Each of the emitter layer E and the drain layer D is shared by the plurality of memory cells MC. Therefore, the numbers of emitter lines EL and bit lines BL can be decreased. This leads to the decrease in interconnection metal amount and the ease of interconnection design.

Conventionally, the emitter layer E is provided on the side of the drain layer D. That is, the emitter layer E is provided on the side of not the source layer S but the drain layer D. In the case where the emitter layer E is adjacent to the drain layer D, the drain layer D functions as the base. When one emitter layer E is shared by the memory cells MC adjacent to each other in the column direction, the data is written in the plurality of memory cells MC arrayed in the same column during the bipolar write. Because the sense amplifier S/A is provided in each column (each bit line), the sense amplifiers S/As cannot store the data of the plurality of memory cells MC arrayed in the same column. Accordingly, in the case where the one emitter layer E is shared by the memory cells MC adjacent to each other in the column direction, unfortunately the sense amplifier S/A cannot perform a refresh operation. The refresh operation shall mean an operation, in which the data is tentatively read from the memory cell and the same data as the read data is restored in the memory cell.

The problem is also generated in the case where the emitter line EL is extended in parallel with the bit line BL even if the emitter layer E does not contact with the drain layer D.

Accordingly, it is necessary that the emitter line EL be extended in the row direction orthogonal to the bit line BL.

In the conventional technique, the emitter layer is adjacent to the drain layer, and the drain layer is caused to function as the base. In the conventional technique, in the case where the emitter layer is shared by the plurality of memory cells adjacent in the column direction, the data is written in the plurality of memory cells adjacent in the column direction when the bit line BL of a certain column is selected. Accordingly, in this case, the bipolar write cannot be performed to the memory cells MC arrayed in the selected row.

In the first embodiment, the emitter layer E is provided so as to be adjacent to the source layer S. Unlike the bit line BL, the emitter line EL and the source line SL can be provided so as to be extended in the row direction like the word line WL. Therefore, in the FBC memory of the first embodiment, each of the emitter layer E and the drain layer D is shared by the plurality of memory cells MC adjacent to each other, and the bipolar write in the memory cells MC arrayed in the selected row can be performed by the above described two steps S10 and S20. Accordingly, in the first embodiment, the data can efficiently be written, and the dimensions of the whole of the memory device can be reduced.

The cell unit CU shown in FIG. 3 has the area of 5F (Feature Size)×2F. The area of the cell unit CU is smaller than the cell unit of the conventional bipolar write type FBC memory.

First Modification of First Embodiment

Figure 9:
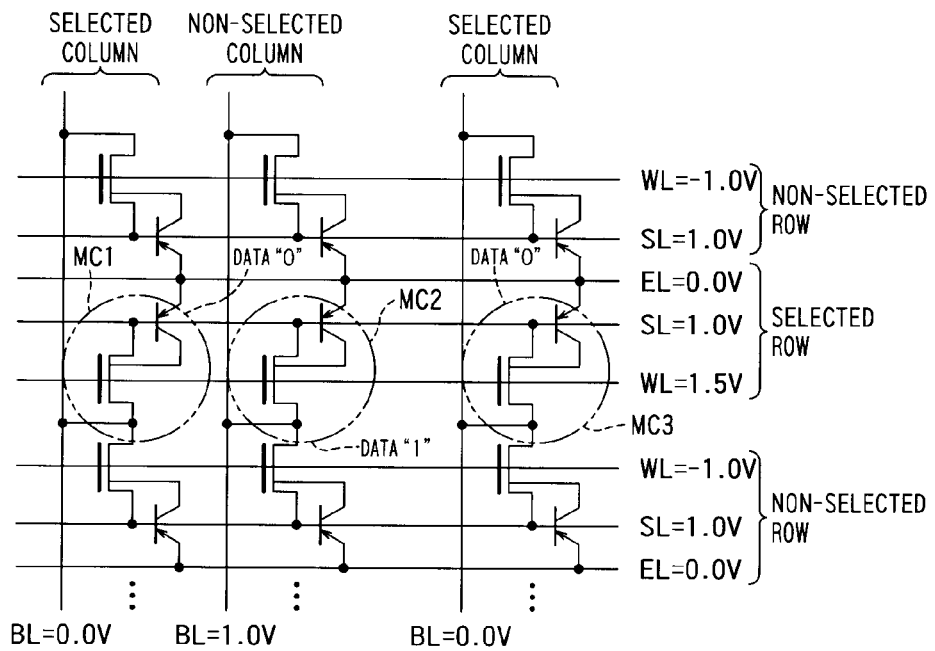
FIG. 9 shows a first modification of the first embodiment.

FIG. 9 shows a first modification of the first embodiment. The first modification differs from the first embodiment in a voltage relationship among the interconnections during the write operation of the data "0". Other operations and configurations of the first modification are similar to those of the first embodiment.

In writing the data "0" of the first modification, the voltage of 0 V is applied to the bit line BL of the selected column, and the voltage of 1.0 V is applied to the bit line BL of the non-selected column. The voltage of 1.0 V is applied to all the source lines SL. The voltage of 1.5 V is applied to the word line WL of the selected row, and the voltage of −1.0 V is applied to the word line WL of the non-selected row. The voltage of 0 V is applied to all the emitter lines EL. That is, in the first modification, the potential relationship between the source line SL of the selected row and the bit line BL of the selected column is opposite to that of the first embodiment.

Thus, in the memory cells MC arrayed in the selected row, the potentials at the bodies B of the memory cells MC1 and MC3 existing in the selected column are higher than the potential at the drain layer D thereof. Accordingly, the forward bias is applied to the pn-junction between the body B and the drain layer D, and the holes accumulated in the body B are emitted to the drain layer D. As a result, the data "0" is written in the memory cells MC1 and MC3.

In the memory cells MC arrayed in the selected row, the potential at the drain layer D of the memory cell MC2 existing in the non-selected column are equal to the potential at the source layer S. The reverse bias can be maintained in the pn-junction between the body B and the source layer S and the pn-junction between the body B and the drain layer D, while the potential at the body B is slightly increased by the coupling with the potential at the word line WL. Accordingly, because the holes accumulated in the body B are not emitted, the data "1" stored in the memory cell MC2 is retained.

The potentials at the word lines WL of the memory cells MC arrayed in the non-selected row are lower than the potentials at the bit line BL and source line SL. In this case, the holes are retained because the potential at the body B becomes sufficiently lower than the potentials at the source layer S and drain layer D.

In the first modification, the same effect as the first embodiment can be obtained.

Second Modification of First Embodiment

Figure 10:
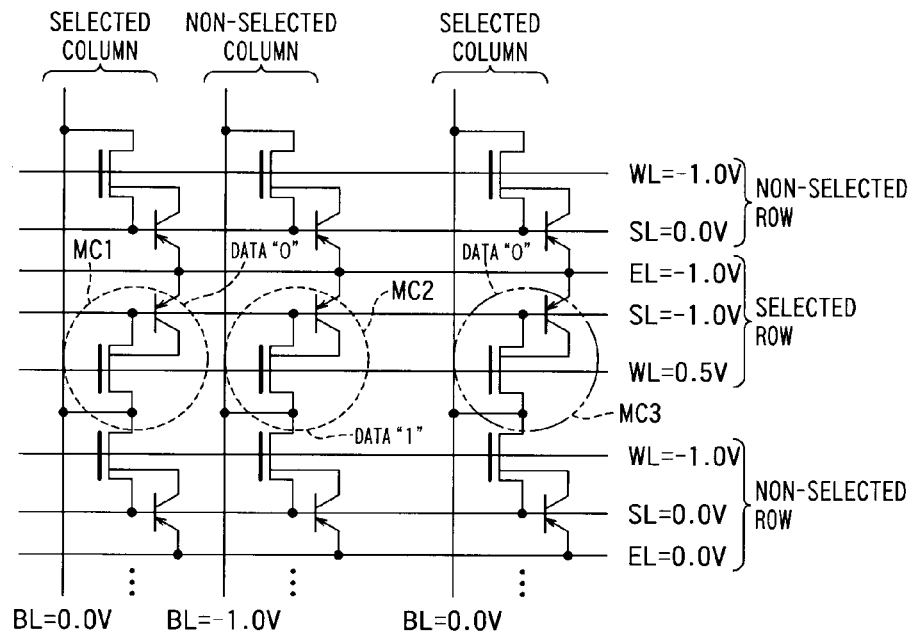
FIG. 10 shows a second modification of the first embodiment.

FIG. 10 shows a second modification of the first embodiment. The second modification differs from the first embodiment in the voltage relationship among the interconnections during the write operation of the data "0". Other operations and configurations of the second modification are similar to those of the first embodiment.

In writing the data "0" of the second modification, the voltage of 0 V is applied to the bit line BL of the selected column, and the voltage of −1.0 V is applied to the bit line BL of the non-selected column. The voltage of −1.0 V is applied to the source lines SL of the selected row and the emitter line EL of the selected row. The voltage of 0 V is applied to the source line SL of the non-selected row and the emitter line EL of the non-selected row. The voltage of 0.5 V is applied to the word line W of the selected row, and the voltage of −1.0 V is applied to the word line WL of the non-selected row.

In the second modification, in the memory cells MC arrayed in the selected row, the potentials at the bodies B of the memory cells MC1 and MC3 existing in the selected column are higher than the potential at the source layer S. Accordingly, the forward bias is applied to the pn-junction between the body B and the source layer S, and the holes accumulated in the body B are emitted to the source layer S. As a result, the data "0" is written in the memory cells MC1 and MC3.

In the memory cells MC arrayed in the selected row, the potential at the drain layer D of the memory cell MC2 existing in the non-selected column are equal to the potential at the source layer S. The reverse bias can be maintained in the pn-junction between the body B and the source layer S and the pn-junction between the body B and the drain layer D, while the potential at the body B is slightly increased by the coupling with the potential at the word line WL. Accordingly, because the holes accumulated in the body B are not emitted, thus, the data "1" stored in the memory cell MC2 is retained.

The potentials at the word lines WL of the memory cells MC arrayed in the non-selected row are lower than the potentials at the bit line BL and source line SL. In this case, the holes are retained because the potential at the body B becomes sufficiently lower than the potentials at the source layer S and drain layer D.

In the second modification, the potentials at the source line SL and emitter line EL of the selected row are lowered by the voltage of 1 V compared with those of the non-selected row (absolute value is raised). Therefore, the potential at the bit line BL can be lowered by 1 V compared with that of the first embodiment, whereby the potential at the word line WL of the selected row can be lowered by 1 V compared with that of the first embodiment. That is, the potentials at the source line SL and emitter line EL of the selected row differ from those of the non-selected row, which decreases the potential difference between the word line WL of the selected row and the word line WL of the non-selected row. The decreased voltage amplitude of the word line WL improves reliability of the memory cell MC. In the second modification, the same effect as the first embodiment can also be obtained.

Third Modification of First Embodiment

Figure 11:
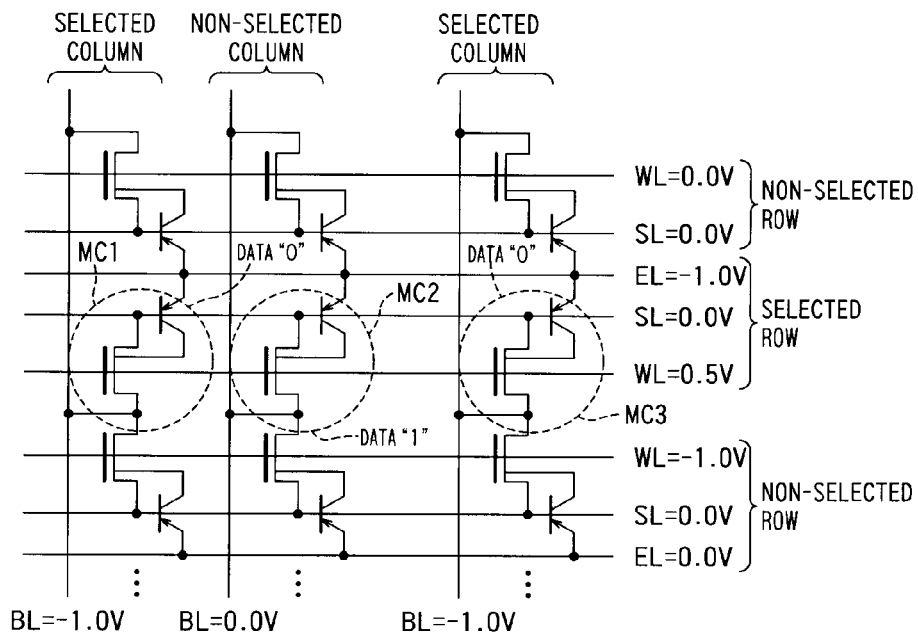
FIG. 11 shows a third modification of the first embodiment.

FIG. 11 shows a third modification of the first embodiment. The third modification differs from the first embodiment in the voltage relationship among the interconnections during the write operation of the data "0". Other operations and configurations of the third modification are similar to those of the first embodiment.

In writing the data "0" of the third modification, the voltage of −1.0 V is applied to the bit line BL of the selected column, and the voltage of 0 V is applied to the bit line BL of the non-selected column. The voltage of 0 V is applied to all the source lines S. The voltage of −1.0 V is applied to the emitter line EL of the selected row, and the voltage of 0 V is applied to the emitter line EL of the non-selected row. The voltage of 0.5 V is applied to the word line WL of the selected row, and the voltage of −1.0 V is applied to the word line WL of the non-selected row. That is, in the third modification, the potential relationship between the source line SL of the selected row and the bit line BL of the selected column is opposite to that of the second modification.

Therefore, in the third modification, the potentials at the bodies B of the memory cells MC1 and MC3 existing in the selected column are higher than the potential at the drain layer D in the memory cells MC arrayed in the selected row. Accordingly, the forward bias is applied to the pn-junction between the body B and the drain layer D, and the holes accumulated in the body B are emitted to the drain layer D. As a result, the data "0" is written in the memory cells MC1 and MC3.

In the memory cells MC arrayed in the selected row, the potential at the drain layer D of the memory cell MC2 existing in the non-selected column are equal to the potential at the source layer S. The reverse bias can be maintained in the pn-junction between the body B and the source layer S and the pn-junction between the body B and the drain layer D, while the potential at the body B is slightly increased by the coupling with the potential at the word line WL. Accordingly, because the holes accumulated in the body B are not emitted, the data "1" stored in the memory cell MC2 is retained.

The potentials at the word lines WL of the memory cells MC arrayed in the non-selected row are lower than the potentials at the bit line BL and source line SL. In this case, the holes are retained because the potential at the body B becomes sufficiently lower than the potentials at the source layer S and drain layer D.

In the third modification, the potential at the emitter line EL of the selected row are lowered by the voltage of 1 V compared with that of the non-selected row (absolute value is raised). Therefore, the potential at the bit line BL can be lowered by 1 V compared with that of the first modification, whereby the potential at the word line WL of the selected row can be lowered by 1 V compared with that of the first modification. That is, the potential at the emitter line EL of the selected row differ from that of the non-selected row, which decreases the potential difference between the word line WL of the selected row and the word line WL of the non-selected row. The decreased voltage amplitude of the word line WL improves the reliability of the memory cell MC, and the decreased voltage amplitude of the word line WL also decreases power consumption. Moreover, in the third modification, the same effect as the first embodiment can also be obtained.

[Data Read Operation and Data Retention Operation]

Figure 12:
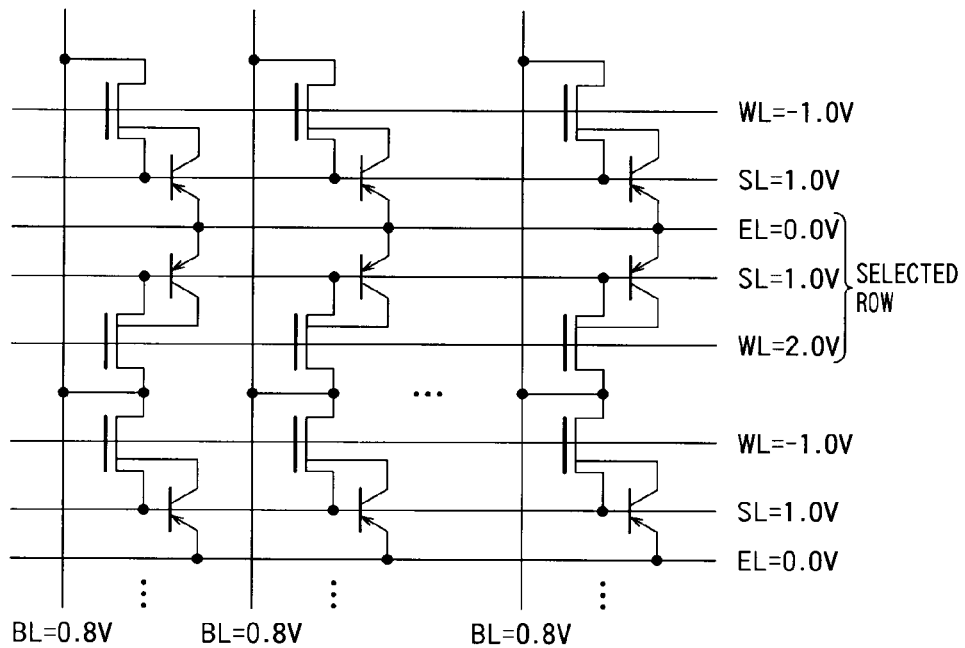
FIG. 12 shows a voltage relationship among the interconnections during the data read operation of the first embodiment.

FIG. 12 shows a voltage relationship among the interconnections during the data read operation of the first embodiment (including first to third modifications). In the data read, the voltage of 0.8 V is applied to the bit line BL. The voltage of 1.0 V is applied to the source line SL. The voltage of 2.0 V is applied to the word line WL of the selected row, and the voltage of −1.0 V is applied to the word line WL of the non-selected row. The voltage of 0 V is applied to the emitter line EL.

Therefore, the memory cells MC arrayed in the selected row are operated in a triode state. The sense amplifier S/A of each column detects and amplifies a difference in drain current changed by the difference of the number of holes accumulated in the body B, whereby the sense amplifier S/A distinguishes the pieces of data "1" and "0" stored in the memory cell MC.

Figure 13:
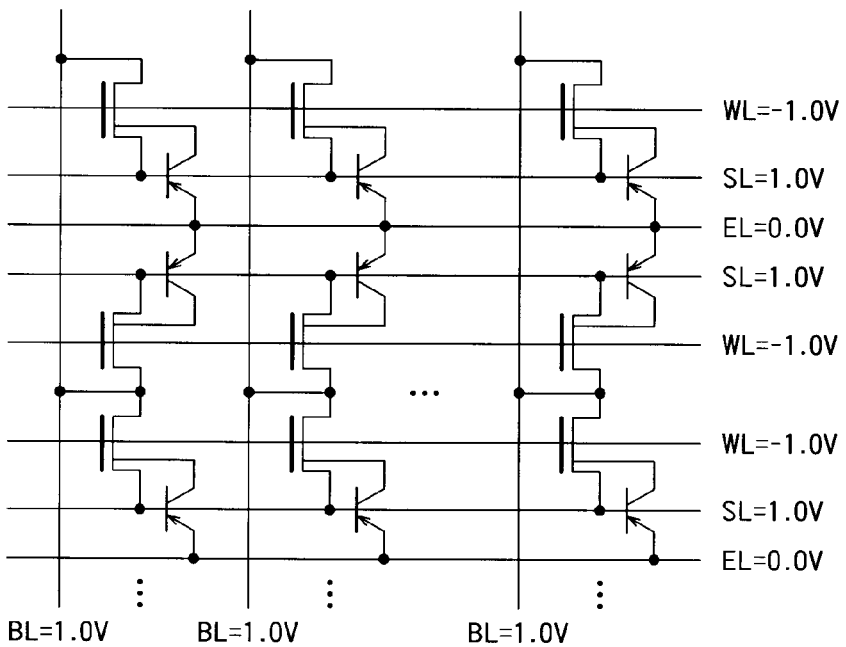
FIG. 13 shows a voltage relationship among the interconnections during the data retention operation of the first embodiment.

FIG. 13 shows a voltage relationship among the interconnections during the data retention operation of the first embodiment. In the data retention operation, the voltage of 1.0 V is applied to the bit line BL. The voltage of 1.0 V is applied to the source line SL. The voltage of −1.0 V is applied to the word line WL. The voltage of 0 V is applied to the emitter line EL. Therefore, the holes are retained in the body B because the potential at the body B is lower than the potentials at the source layer S and drain layer D.

In the first embodiment, the drain layer D is shared by the plurality of memory cells MC adjacent to each other. In this case, in writing the data "1", the holes injected into the body B from the emitter layer E is possibly injected into the body B of the adjacent memory cell MC through the drain layer D. In order to prevent the bipolar disturbance, preferably an impurity concentration of the drain layer D is increased and/or a silicide layer is formed on the drain layer D.

Second Embodiment

In a second embodiment, the emitter layer E is buried in the BOX layer 20, and the emitter layer E is provided between the source layer S and the silicon substrate 10 while the BOX layer 20 is interposed. The potential at the emitter layer E is controlled through the silicon substrate 10. Accordingly, the emitter line EL is not required in the second embodiment. Other configurations of the second embodiment are similar to that of the first embodiment.

Figure 14:
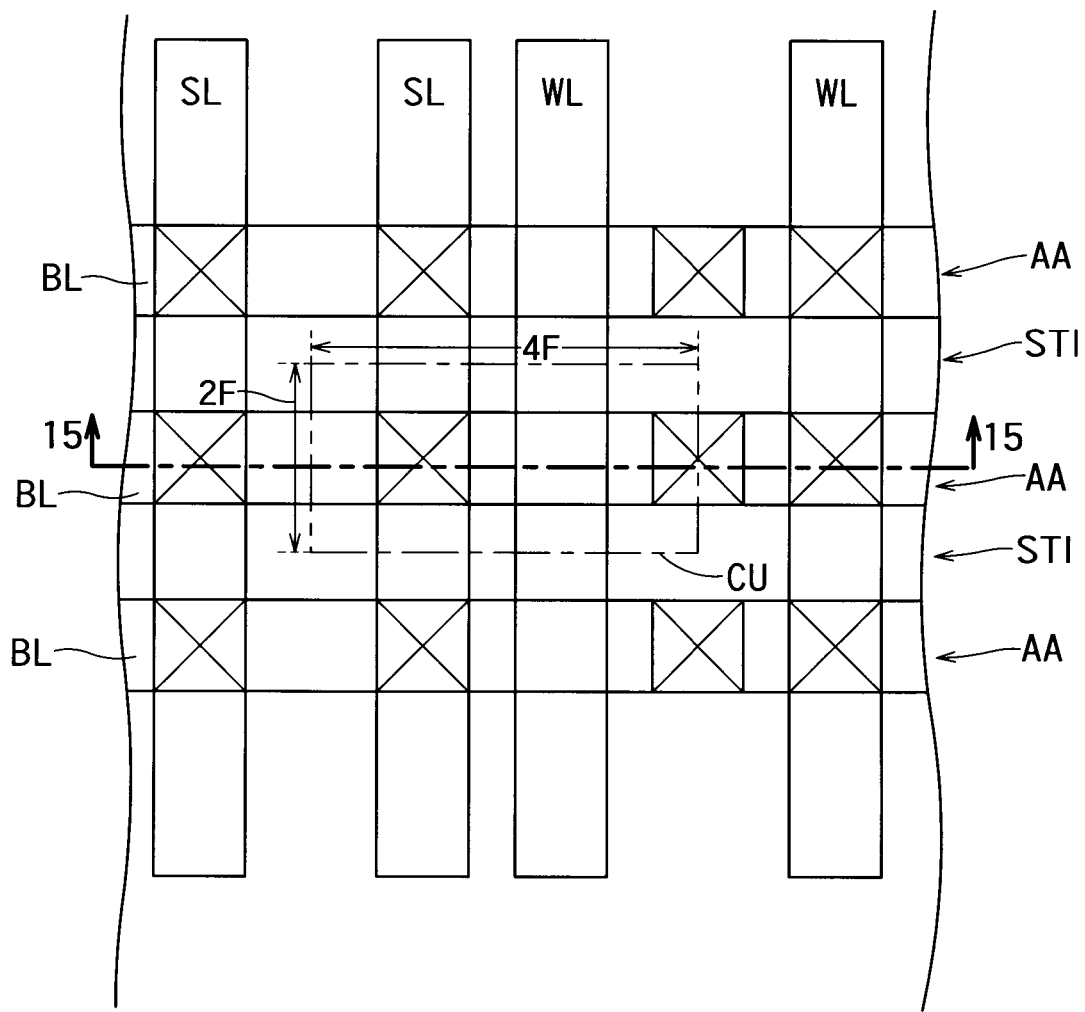
FIG. 14 is a plan view showing an interconnection layout of an FBC memory of the second embodiment.

FIG. 14 is a plan view showing an interconnection layout of an FBC memory of the second embodiment. In the second embodiment, because the emitter line EL is not required, the area of the cell unit CU is further reduced. Particularly, in the second embodiment, the cell unit CU has the area of 4F×2F which is smaller than that of the first embodiment. F (Feature Size) is a width of the smallest pattern in a state of the art.

Figure 15:
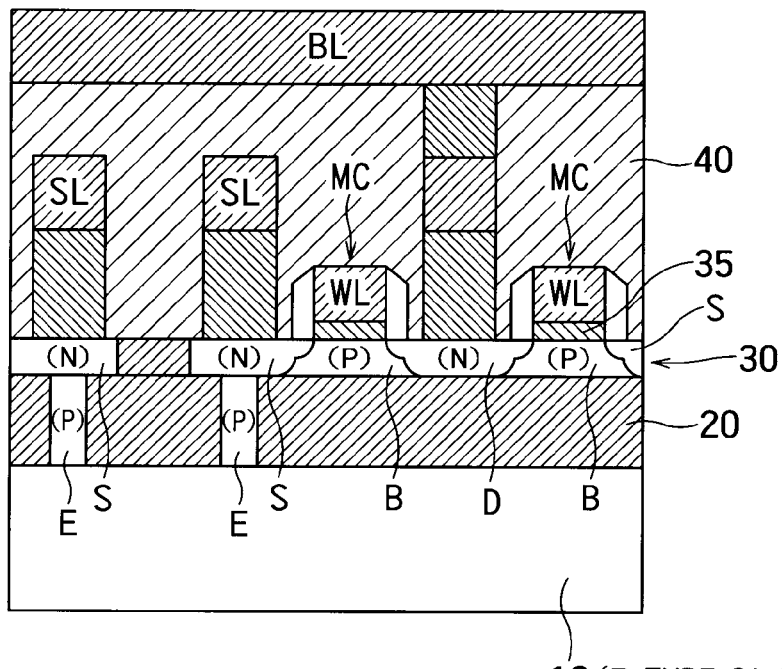
FIG. 15 is a sectional view taken along a line 15-15 of FIG. 14.

FIG. 15 is a sectional view taken along a line 15-15 of FIG. 14. Because a sectional view taken along the word line WL is similar to that of FIG. 5, the drawing is neglected. As shown in FIG. 15, the emitter layer E is buried in the BOX layer 20 located immediately below the source layer S. The emitter layer E made of p-type polysilicon is electrically connected to the p-type silicon substrate 10. The emitter layer E contacts with the bottom portion of the source layer S, and the emitter layer E and the source layer S form the pn-junction. The source layers S are separated in each row.

It is necessary that the emitter layers E be kept at the same potential as a whole in order to perform a control through the silicon substrate 10. Therefore, in the operations shown in FIGS. 7 to 13, the FBC memory of the second embodiment can perform the operations except for the operations shown in FIGS. 10 and 11.

In the second embodiment, although the potential at the emitter layer E cannot be set for each row, the area of the cell unit CU can further be reduced. In the second embodiment, the same effect as the first embodiment can also be obtained.

Third Embodiment

Figure 16:
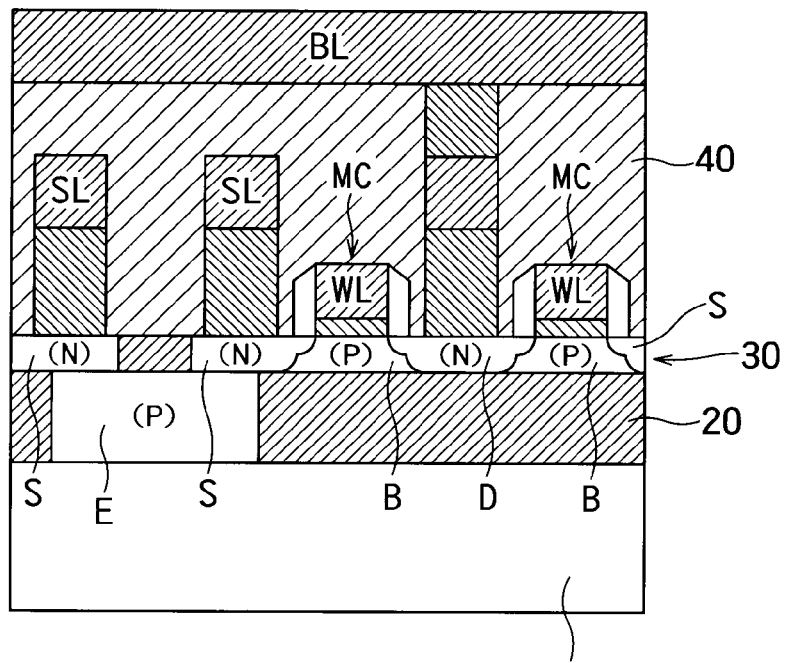
FIG. 16 is a sectional view showing a FBC memory according to a third embodiment of the invention.

FIG. 16 is a sectional view showing a FBC memory according to a third embodiment of the invention. The third embodiment differs from the second embodiment in that the plurality of emitter layers E adjacent to each other in the column direction are integrally formed. Other configurations of the third embodiment are similar to that of the second embodiment. Because the same potential is applied to all the emitter layers E from the silicon substrate 10, the emitter layers E adjacent to each other may integrally be formed as shown in FIG. 16. Therefore, because the area in which the BOX layer 20 is removed is widened in a process of forming the emitter layer E, advantageously a silicon plug of the emitter layer E is easily formed. In the third embodiment, the same effect as the second embodiment can also be obtained.

In the first to third embodiments, the address terms of the row direction and the column direction are expediency, and they may be replaced with each other. In the first to third embodiments, the memory cell MC may be formed by a p-type MISFET. In this case, the charge of electrons is accumulated in the memory cell MC. The conductive type of the emitter layer E becomes a P-type. Accordingly, during the data write operation, data read operation, and data retention operation, in the potentials at the word line WL, bit line BL, source line SL, and emitter line EL of the p-type MISFET, the absolute values are similar to those of the n-type MISFET while the signs are opposite to each other.

What is claimed is:

1. A semiconductor storage device having plural memory cells arranged in a two dimensional matrix and operationally related to word lines and bit lines which extend in first and second intersecting directions, comprising:
   a semiconductor substrate;
   an insulation layer provided on the semiconductor substrate;
   a semiconductor layer provided on the insulation layer; each memory cell including,
      a source layer provided in the semiconductor layer,
      a drain layer provided in the semiconductor layer, and
      a body provided in the semiconductor layer between the source layer and the drain layer, the body being in an electrically floating state, and accumulating or emitting a charge to store data;
   an emitter layer contacting the source layer, the emitter layer having an opposite conductive type to the source layer;
   a respective word line being provided to memory cells arrayed in the first direction;
   a source line connected to the source layers of the memory cells arrayed in the first direction; and
   a respective bit line connected to the drain layers of the memory cells arrayed in the second direction intersecting the first direction.

2. The semiconductor storage device according to claim 1, further comprising:
   an emitter line connected to the emitter layers of the memory cells arrayed in the first direction.

3. The semiconductor storage device according to claim 1, wherein the emitter layer is buried in the insulation layer, and the emitter layer is interposed between the source layer and the semiconductor substrate.

4. The semiconductor storage device according to claim 1, wherein
   the emitter layer is shared by the plurality of memory cells adjacent to each other in the second direction.

5. The semiconductor storage device according to claim 2, wherein
   the emitter layer is shared by the plurality of memory cells adjacent to each other in the second direction.

6. The semiconductor storage device according to claim 3, wherein
   the emitter layer is shared by the plurality of memory cells adjacent to each other in the second direction.

7. The semiconductor storage device according to claim 1, wherein
   the drain layer is shared by the plurality of memory cells adjacent to each other in a direction in which the bit line is extended.

8. The semiconductor storage device according to claim 2, wherein
   the word line, the source line, and the emitter line are connected to the memory cells arrayed in the first direction, and
   the bit line is connected to the memory cells arrayed in the second direction.

9. The semiconductor storage device according to claim 1, wherein
   a bipolar transistor includes the body, the source layer, and the emitter layer, and
   the bipolar transistor is driven when data is written in the memory cell.

10. The semiconductor storage device according to claim 2, wherein
    a bipolar transistor includes the body, the source layer, and the emitter layer, and
    the bipolar transistor is driven when data is written in the memory cell.

11. The semiconductor storage device according to claim 3, wherein
    a bipolar transistor includes the body, the source layer, and the emitter layer, and
    the bipolar transistor is driven when data is written in the memory cell.

12. The semiconductor storage device according to claim 3, wherein
    the emitter layer is made of a conductive type semiconductor which conductive type is identical to a conductive type of the semiconductor substrate.

* * * * *